(12) United States Patent
Dewey et al.

(10) Patent No.: US 11,437,405 B2
(45) Date of Patent: Sep. 6, 2022

(54) TRANSISTORS STACKED ON FRONT-END P-TYPE TRANSISTORS

(71) Applicant: Intel Corporation, Santa Clara, CA (US)

(72) Inventors: Gilbert Dewey, Beaverton, OR (US); Patrick Morrow, Portland, OR (US); Aaron Lilak, Beaverton, OR (US); Willy Rachmady, Beaverton, OR (US); Anh Phan, Beaverton, OR (US); Ehren Mannebach, Beaverton, OR (US); Hui Jae Yoo, Hillsboro, OR (US); Abhishek Sharma, Hillsboro, OR (US); Van H. Le, Portland, OR (US); Cheng-Ying Huang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 922 days.

(21) Appl. No.: 16/024,696

(22) Filed: Jun. 29, 2018

(65) Prior Publication Data

US 2020/0006388 A1 Jan. 2, 2020

(51) Int. Cl.
| | | |
|---|---|---|
| *H01L 29/78* | (2006.01) | |
| *H01L 27/12* | (2006.01) | |
| *H01L 21/82* | (2006.01) | |
| *H01L 29/786* | (2006.01) | |
| *H01L 21/8258* | (2006.01) | |

(52) U.S. Cl.
CPC ...... *H01L 27/1207* (2013.01); *H01L 21/8258* (2013.01); *H01L 29/78* (2013.01); *H01L 29/785* (2013.01); *H01L 29/7869* (2013.01)

(58) Field of Classification Search
CPC ..... H01L 29/78; H01L 29/785; H01L 29/786; H01L 29/7869; H01L 27/12; H01L 27/12; H01L 27/1207; H01L 21/82; H01L 21/825; H01L 21/8258
USPC .......................................................... 257/43
See application file for complete search history.

(56) References Cited

U.S. PATENT DOCUMENTS

2019/0393249 A1* 12/2019 Lilak .................. H01L 27/0688

* cited by examiner

*Primary Examiner* — Monica D Harrison
(74) *Attorney, Agent, or Firm* — Schwabe Williamson & Wyatt P.C.

(57) ABSTRACT

Embodiments herein describe techniques for an integrated circuit (IC). The IC may include a first transistor, an insulator layer above the first transistor, and a second transistor above the insulator layer. The first transistor may be a p-type transistor including a channel in a substrate, a first source electrode, and a first drain electrode. A first metal contact may be coupled to the first source electrode, while a second metal contact may be coupled to the first drain electrode. The insulator layer may be next to the first metal contact, and next to the second metal contact. The second transistor may include a second source electrode, and a second drain electrode. The second source electrode may be coupled to the first metal contact, or the second drain electrode may be coupled to the second metal contact. Other embodiments may be described and/or claimed.

25 Claims, 6 Drawing Sheets

TRANSISTORS STACKED ON FRONT-END P-TYPE TRANSISTORS

FIELD

Embodiments of the present disclosure generally relate to the field of integrated circuits, and more particularly, to transistors.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Transistors may be located in various locations of an integrated circuit (IC). For example, a conventional transistor may have a channel typically within a substrate, such as a silicon substrate. On the other hand, a thin-film transistor (TFT) is a kind of field-effect transistor including a channel layer, a gate electrode, and source and drain electrodes, over a supporting but non-conducting substrate. TFTs have emerged as an attractive option to fuel Moore's law by including TFTs vertically in the back-end of the line (BEOL), while leaving the silicon substrate areas for high-speed transistors. However, integration of TFTs may still be a problem.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
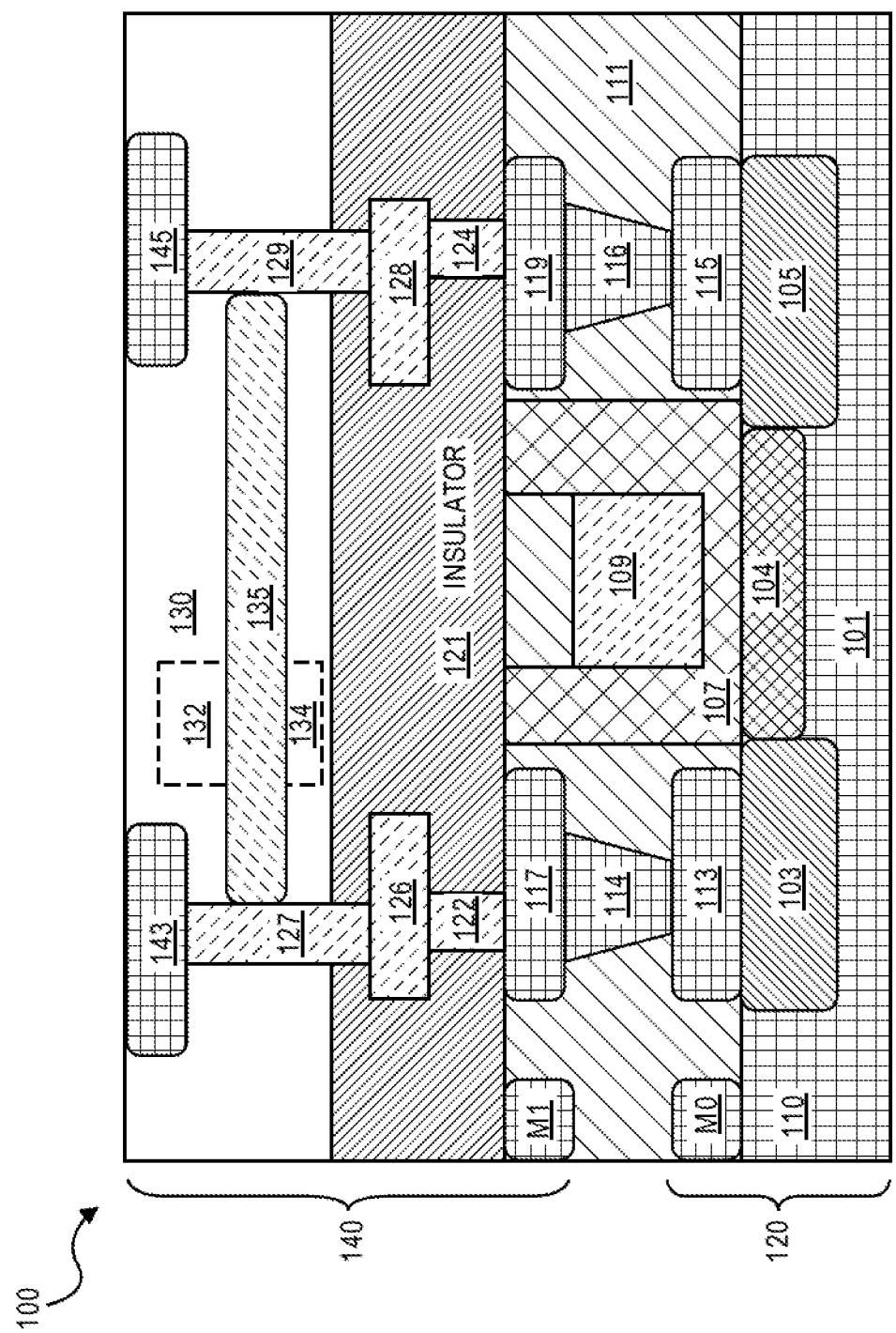
FIG. 1 schematically illustrates a diagram of an integrated circuit (IC) including a second transistor stacked over a first transistor with a channel in a substrate, in accordance with some embodiments.

Front-end-of-line (FEOL) semiconductor processing and structures may refer to a first portion of integrated circuit (IC) fabrication where individual devices (e.g., transistors, capacitors, resistors, etc.) are patterned in a semiconductor substrate or layer. FEOL generally covers everything up to (but not including) the deposition of metal interconnect layers. A transistor formed in FEOL may also be referred to as a front-end transistor. Following the last FEOL operation, the result is typically a wafer with isolated transistors (e.g., without any wires). Back end of line (BEOL) semiconductor processing and structures may refer to a second portion of IC fabrication where the individual devices (e.g., transistors, capacitors, resistors, etc.) are interconnected with wiring on the wafer, e.g., the metallization layer or layers. BEOL includes metal contacts, dielectrics layers, metal levels, and bonding sites for chip-to-package connections. In the BEOL part of the fabrication, metal contacts, pads, interconnect wires, vias, and dielectric structures may be formed. For modern IC processes, more than 10 metal layers may be added in the BEOL. Embodiments described below may be applicable to FEOL processing and structures, BEOL processing and structures, or both FEOL and BEOL processing and structures.

A thin-film transistor (TFT) is a kind of field-effect transistor formed at BEOL and including a channel layer, a gate electrode, and source and drain electrodes, over a supporting but non-conducting substrate. There may be various configurations for a TFT based on positions of the electrodes: top gate top electrode, top gate bottom electrode, bottom gate bottom electrode, and bottom gate top electrode. Conventionally, when a TFT may be stacked over and coupled to a transistor, e.g., a front-end p-type transistor, the front-end p-type transistor may not have metal contacts due to temperature constraints of forming the TFT transistor. For example, the TFT transistor may be formed over 450° C., which may melt any metal contact for the front-end p-type transistor. Instead, a deep contact may be used to couple a source or drain area of the front-end p-type transistor and a source or drain area of the TFT. However, such deep contacts may induce more resistance between the front-end p-type transistor and the TFT, with possibly large misalignments due to the length of the deep contacts. Alternatively, multiple transistors may be stacked by a layer transfer process or a silicon on insulator (SOI) wafer, where multiple substrates, e.g., silicon substrate, may be used.

Embodiments herein may present an IC including a second transistor stacked over a first transistor with a channel in a substrate, e.g., a front-end transistor. A front-end p-type transistor may be formed. Full metal contacts may be coupled to the source electrode and the drain electrode of the front-end p-type transistor. Instead of a normal dielectrics layer at the BEOL, an insulator layer including isolation oxide may be formed on top of the metal contacts coupled to the front-end p-type transistor. In addition, a second transistor may be formed over the insulator layer at low processing temperatures, e.g., less than 450° C. Instead of using one deep contact, the source electrode or the drain electrode of the second transistor may be coupled to the source electrode or the drain electrode of the front-end p-type transistor through vias and the metal contact next to the insulator layer. Therefore, the connection between the source electrode or the drain electrode of the second transistor and the source electrode or the drain electrode of the front-end p-type transistor is less resistive with less misalignment, compared to a connection formed by deep contacts. In addition, the second transistor may be stacked over and coupled to a front-end p-type transistor without additional substrate, or layer transfer and bonding.

Embodiments herein may present an IC including a first transistor, an insulator layer above the first transistor, and a second transistor above the insulator layer. The first transistor may be a p-type transistor with a channel in a substrate, and may include a first source electrode and a first drain electrode. A first metal contact may be coupled to the first source electrode by a first via, while a second metal contact may be coupled to the first drain electrode by a second via. The insulator layer may be next to the first metal contact, and next to the second metal contact. The second transistor may include a second source electrode, and a second drain electrode. The second source electrode may be coupled to the first metal contact, or the second drain electrode may be coupled to the second metal contact.

Embodiments herein may present a method for forming an IC. The method may include forming a first transistor, wherein the first transistor may be a p-type transistor with a channel in a substrate, and the first transistor may include a first source electrode and a first drain electrode. The method may further include forming a first metal contact coupled to the first source electrode by a first via, and forming a second metal contact coupled to the first drain electrode by a second via. In addition, the method may include forming an insulator layer above the first transistor, wherein the insulator layer may be next to the first metal contact, and next to the second metal contact. Furthermore, the method may include forming a second transistor above the insulator layer, wherein the second transistor may include a second source electrode and a second drain electrode. The second source electrode may be coupled to the first metal contact, or the second drain electrode may be coupled to the second metal contact.

In embodiments, a computing device may include a circuit board and an IC coupled to the circuit board. The IC may include a first transistor, an insulator layer above the first transistor, and a second transistor above the insulator layer. The first transistor may be a p-type transistor with a channel in a substrate, and may include a first source electrode and a first drain electrode. A first metal contact may be coupled to the first source electrode by a first via; while a second metal contact may be coupled to the first drain electrode by a second via. The insulator layer may be next to the first metal contact, and next to the second metal contact. The second transistor may include a second source electrode, and a second drain electrode. The second source electrode may be coupled to the first metal contact, or the second drain electrode may be coupled to the second metal contact.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate.

In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And, in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (Sift), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates a diagram of an IC 100 including a second transistor 130 stacked over a first transistor 110 with a channel 104 in a substrate 101, in accordance with some embodiments. For clarity, features of the IC 100, the transistor 130, the transistor 110, the channel 104, and the substrate 101 may be described below as examples for understanding an example IC, a transistor, a channel, and a substrate. It is to be understood that there may be more or fewer components within an IC, a transistor, a channel, and a substrate. Further, it is to be understood that one or more of the components within an example IC, a transistor, a channel, and a substrate, may include additional and/or varying features from the description below, and may include any device that one having ordinary skill in the art would consider and/or refer to as an example IC, a transistor, a channel, and a substrate.

In embodiments, the IC 100 may include the transistor 110, an insulator layer 121 above the transistor 110, and the transistor 130 above the insulator layer 121. The transistor 110 may be at FEOL 120, while the transistor 130 and the insulator layer 121 may be at BEOL 140. The transistor 110 may be a planar transistor, or a FinFET transistor.

In embodiments, the transistor 110 may be a p-type transistor, and may include the channel 104 in the substrate 101, a source electrode 113 above a source area 103, and a drain electrode 115 above a drain area 105. The channel 104 may be between the source area 103 and the drain area 105. The transistor 110 may further include a gate electrode 109 above the channel 104 separated by a gate dielectric layer 107.

In embodiments, the source electrode 113 may be coupled to a metal contact 117 by a via 114, and the drain electrode 115 may be coupled to a metal contact 119 by a via 116. The source electrode 113, the metal contact 117, the via 114, the drain electrode 115, the metal contact 119, the via 116, and the gate electrode 109 may be within an ILD layer 111. The metal contact 117 and the metal contact 119 may be located in a first metal layer M1, while the source electrode 113 and the drain electrode 115 may be located in the metal layer M0.

In embodiments, the insulator layer 121 may be next to the metal contact 117 and the metal contact 119. The insulator layer 121 may include metal contacts, e.g., a metal contact 126, or a metal contact 128. The metal contact 126 may be coupled to the metal contact 117 by a via 122. Similarly, the metal contact 128 may be coupled to the metal contact 119 by a via 124. The insulator layer 121 may be of a planar shape, and includes an oxide material. The insulator layer 121 may have a thickness in a range of about 10 nm to about 100 nm. The insulator layer 121 may include materials such as any material for standard BEOL dielectric layers. That is one of the benefits of this TFT stacking approach. The materials for the insulator layer 121 may be chosen so that the insulator layer 121 may be compatible with all the standard back end metals and etch processes. For example, the insulator layer 121 may include $SiO_2$, SiON, SiN, $Al_2O_3$, AlSiOx, or any dielectric material with a dielectric constant less than 8. In some embodiments, the insulator layer 121 may include an oxide material with a dielectric constant less than 4 to reduce parasitic capacitance. The insulator layer 121 may be made by any deposition method, e.g., ALD, CVD, or PECVD.

In embodiments, the transistor 130 may include a source electrode 143, a drain electrode 145 above a channel layer 135. The source electrode 143 and the drain electrode 145 may be in any of the metal layer of the BEOL 140, e.g., M2 to M10, or higher. There may be additional dielectric layer, e.g., ILD layers, between the channel layer 135 and the insulator layer 121. A shadow of the transistor 130 may be substantially overlapped with the transistor 110. The source electrode 143 may be coupled to the metal contact 126 in the insulator layer 121 by a via 127, and the drain electrode 145 may be coupled to the metal contact 128 by a via 129. The connections between the source electrode 143 and the metal contact 126 by the via 127 may be optional. There may be no metal contact 126 inside the insulator layer 121, and the via 127 may extend through the insulator layer 121 to be directly coupled to the metal contact 117. Similarly, there may be no metal contact 128 inside the insulator layer 121, and the via 129 may extend through the insulator layer 121 to be directly coupled to the metal contact 119. Through the metal contact 117, the source electrode 143 of the transistor 130 may be coupled to the source electrode 113 of the transistor 110. Through the metal contact 119, the drain electrode 145 of the transistor 130 may be coupled to the drain electrode 115 of the transistor 110. Compared to one deep contact to couple the source electrode 143 and the source electrode 113 without any metal contact in between, the connection formed by the via 127, the metal contact 126, the via 122, the metal contact 117, and the via 114 may have smaller resistance, and reduced misalignment. In some embodiments, there may be no connection between the source electrode 143 and the source electrode 113, or no connection between the drain electrode 145 and the drain electrode 115. In addition, the transistor 130 may have a gate electrode 132 above the channel layer 135, which is separated from the channel layer 135 by a gate dielectric layer, not shown. Alternatively, the transistor 130 may have a gate electrode 134 below the channel layer 135, which is separated from the channel layer 135 by a gate dielectric layer, not shown.

In embodiments, it is shown that the source electrode 143 of the transistor 130 is coupled to the source electrode 113 of the transistor 110. Other connections may be made. For example, the source electrode 143 of the transistor 130 may be coupled to the drain electrode 115 of the transistor 110, or to the gate electrode 109 of the transistor 110. Any one of the source electrode 113, the drain electrode 115, or the gate electrode 109 of the transistor 110 may be coupled to any one of the source electrode 143, the drain electrode 145, or the gate electrode of the transistor 130. In addition, the transistor 110 is a p-type transistor, and the transistor 130 may be an n-type transistor. Hence, the transistor 110 and the transistor 130 may form complementary metal oxide semiconductor (CMOS) transistors. Conventionally, CMOS circuits may be formed within the substrate 101 where n-type transistors and p-type transistors may be placed side-by-side. A CMOS circuits formed by an n-type transistor, e.g., the transistor 130, stacked over a p-type transistor, e.g., the transistor 110, may be more compact with better performance in terms of speed.

In embodiments, the transistor 130 may be a p-type transistor, or an n-type transistor, while the channel layer 135 may include high performance semiconducting oxides. Such high performance semiconducting oxides included in the channel layer 135 may be different from the traditional channel materials for TFTs. For example, the channel layer 135 may include high performance oxides that can be processed at low processing temperatures, e.g., less than 450° C. When a high performance oxide is processed at a low processing temperature, e.g., less than 450° C., the processing of the transistor 130 may not cause damage or melt the metal contacts, e.g., the metal contact 117 or the metal contact 119 in M1.

For example, the transistor 130 may be a p-type transistor, and the channel layer 135 may include a material selected from CuO, $ZnRh_2O_4$, $AlCuO_2$, $SrCu_2O_2$, $La_2SeO_2$, $Pr_2SeO_2$, $Nd_2SeO_2$, $Gd_2SeO_2$, NiO, SiC, SnO, $Cu_2O$, or $VO_2$, or $VO_2$, or an oxide alloyed or doped with S, Se, Te, or an element to raise a valence-band of the oxide to be a doped p-type oxide. These p-type materials may possess enough carrier mobility suitable for complementary logic used in a multiple TFT assembly. Additionally and alternatively, the transistor 130 may be an n-type transistor, and the channel layer 135 may include a material selected from ZnO, CdO, $In_2O_3$, $Ga_2O_3$, $SnO_2$, IGZO, IZO, ITO, GZO, $TiO_2$, SiC, SnO, $Cu_2O$, or $VO_2$, or an oxide alloyed or doped with In, Sn, Zn, Mo, Ti, Co, Cd, to lower a conduction band of the oxide to be a doped n-type oxide. Additionally and alternatively, in embodiments, the channel layer 135 may include a material comprising amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), AlZnO, HfInZnO (HIZO), AlSnZnInO, AlSnZnO (ATZO).

In embodiments, the substrate 101 may be a silicon substrate, a glass substrate, such as soda lime glass or borosilicate glass, a metal substrate, a plastic substrate, or another suitable substrate. In addition, some dielectric layer or other devices may be formed on the substrate 101, not shown for clarity.

In embodiments, the gate dielectric layer 107 may include a silicon oxide (SiO) film, a silicon nitride (SiN) film, $O_3$-tetraethylorthosilicate (TEOS), $O_3$-hexamethyldisiloxane (HMDS), plasma-TEOS oxide layer, or other suitable materials. For example, the gate dielectric layer 107 may include silicon and oxygen, silicon and nitrogen, yttrium and oxygen, silicon, oxygen, and nitrogen, aluminum and oxygen, hafnium and oxygen, tantalum and oxygen, or titanium and oxygen. For example, the gate dielectric layer 107 may include silicon oxide ($SiO_2$), silicon nitride ($SiN_x$), yttrium oxide ($Y_2O_3$), silicon oxynitride ($SiO_xN_y$), aluminum oxide ($Al_2O_3$), hafnium(IV) oxide ($HfO_2$), tantalum oxide ($Ta_2O_5$), titanium dioxide ($TiO_2$), or other materials.

In embodiments, the gate electrode 109, the source electrode 113, the drain electrode 115, the metal contact 117, the metal contact 119, the metal contact 126, the metal contact 128, the source electrode 143, the drain electrode 145, the via 114, the via 116, the via 122, the via 124, the via 127, and the via 129, may be formed as a single layer or a stacked layer using one or more conductive films including a conductive material. For example, the gate electrode 109, the source electrode 113, the drain electrode 115, the metal contact 117, the metal contact 119, the metal contact 126, the metal contact 128, the source electrode 143, the drain electrode 145, the via 114, the via 116, the via 122, the via 124, the via 127, and the via 129, may include gold (Au), platinum (Pt), ruthenium (Ru), iridium (Ir), titanium (Ti), aluminum (Al), molybdenum (Mo), copper (Cu), tantalum (Ta), tungsten (W), nickel (Ni), chromium (Cr), hafnium (Hf), indium (In), or an alloy of Ti, Mo, Au, Pt, Al Ni, Cu, Cr, TiAlN, HfAlN, or InAlO. For example, the gate electrode 109, the source electrode 113, the drain electrode 115, the metal contact 117, the metal contact 119, the metal contact 126, the metal contact 128, the source electrode 143, the drain electrode 145, the via 114, the via 116, the via 122, the via 124, the via 127, and the via 129, may include tantalum nitride (TaN), titanium nitride (TiN), iridium-tantalum alloy (Ir—Ta), indium-tin oxide (ITO), the like, and/or a combination thereof.

There may be additional components, e.g., a spacer, a passivation layer, included in the transistor 110 or the transistor 130, which are not shown in FIG. 1. For example, the transistor 110 or the transistor 130 may include a spacer with a dielectric material, a passivation layer having one or more materials capable of providing passivation, such as physical, chemical and/or electrical insulation, isolation, stability and/or separation between two or more other layers.

Figure 2:
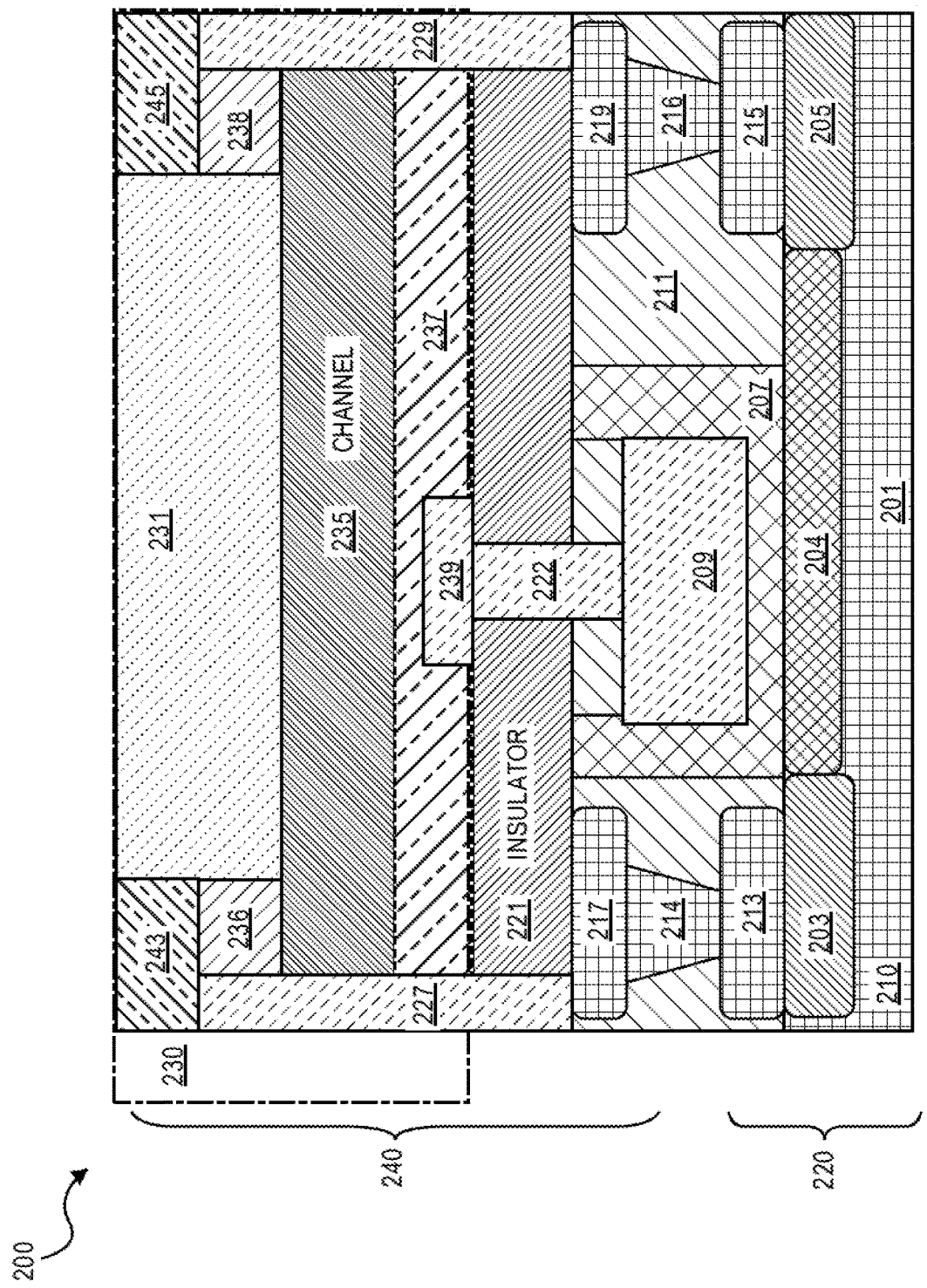
FIG. 2 schematically illustrates a diagram of an IC including a second transistor stacked over a first transistor with a channel in a substrate, in accordance with some embodiments.

FIG. 2 schematically illustrates a diagram of an IC 200 including a second transistor 230 stacked over a first transistor 210 with a channel 204 in a substrate 201, in accordance with some embodiments. In embodiments, the IC 200, the transistor 230, the transistor 210, the channel 204, and the substrate 201 may be similar to the IC 100, the transistor 130, the transistor 110, the channel 104, and the substrate 101 shown in FIG. 1. Various other layers of the IC 200, the transistor 230, and the transistor 210, may be similar to corresponding layers in the IC 100, the transistor 130, and the transistor 110, in FIG. 1.

In embodiments, the IC 200 may include the transistor 210, an insulator layer 221 above the transistor 210, and the transistor 230 above the insulator layer 221. The transistor 210 may be at FEOL 220, while the transistor 230 and the insulator layer 221 may be at BEOL 240. The transistor 210 may be a p-type transistor, and may include the channel 204 in the substrate 201, a source electrode 213 above a source area 203, and a drain electrode 215 above a drain area 205. The channel 204 may be between the source area 203 and the drain area 205. The transistor 210 may further include a gate electrode 209 above the channel 204 separated by a gate dielectric layer 207.

In embodiments, the source electrode 213 may be coupled to a metal contact 217 by a via 214, and the drain electrode 215 may be coupled to a metal contact 219 by a via 216. The source electrode 213, the metal contact 217, the via 214, the drain electrode 215, the metal contact 219, the via 216, and the gate electrode 209 may be within an ILD layer 211. The metal contact 217 and the metal contact 219 may be located in a first metal layer M1, while the source electrode 213 and the drain electrode 215 may be located in the metal layer M0. In embodiments, the insulator layer 221 may be next to the metal contact 217 and the metal contact 219. The insulator layer 121 may include metal contacts, not shown.

In embodiments, the transistor 230 may be a thin film transistor (TFT) with a gate electrode above the insulator layer, and a channel layer above the gate electrode. In detail, the transistor 230 may include a gate electrode 239 above the insulator layer 221, a channel layer 235 above the gate electrode 239 and separated by a gate dielectric layer 237, a source area 236 adjacent to the channel layer 235, a drain area 238 adjacent to the channel layer 235, a source electrode 243 above the source area 236, and a drain electrode 245 above the drain area 238, where the source electrode 243 and the drain electrode 245 may be separated by an ILD layer 231 from the source electrode 243.

In embodiments, the source electrode 243 may be coupled with the metal contact 217 by a via 227 through the insulator layer 221. The drain electrode 245 may be coupled with the metal contact 219 by a via 229 through the insulator layer 221. The gate electrode 239 of the transistor 230 may be coupled with the gate electrode 209 of the transistor 210 by a via 222 through the insulator layer 221.

Figure 3:
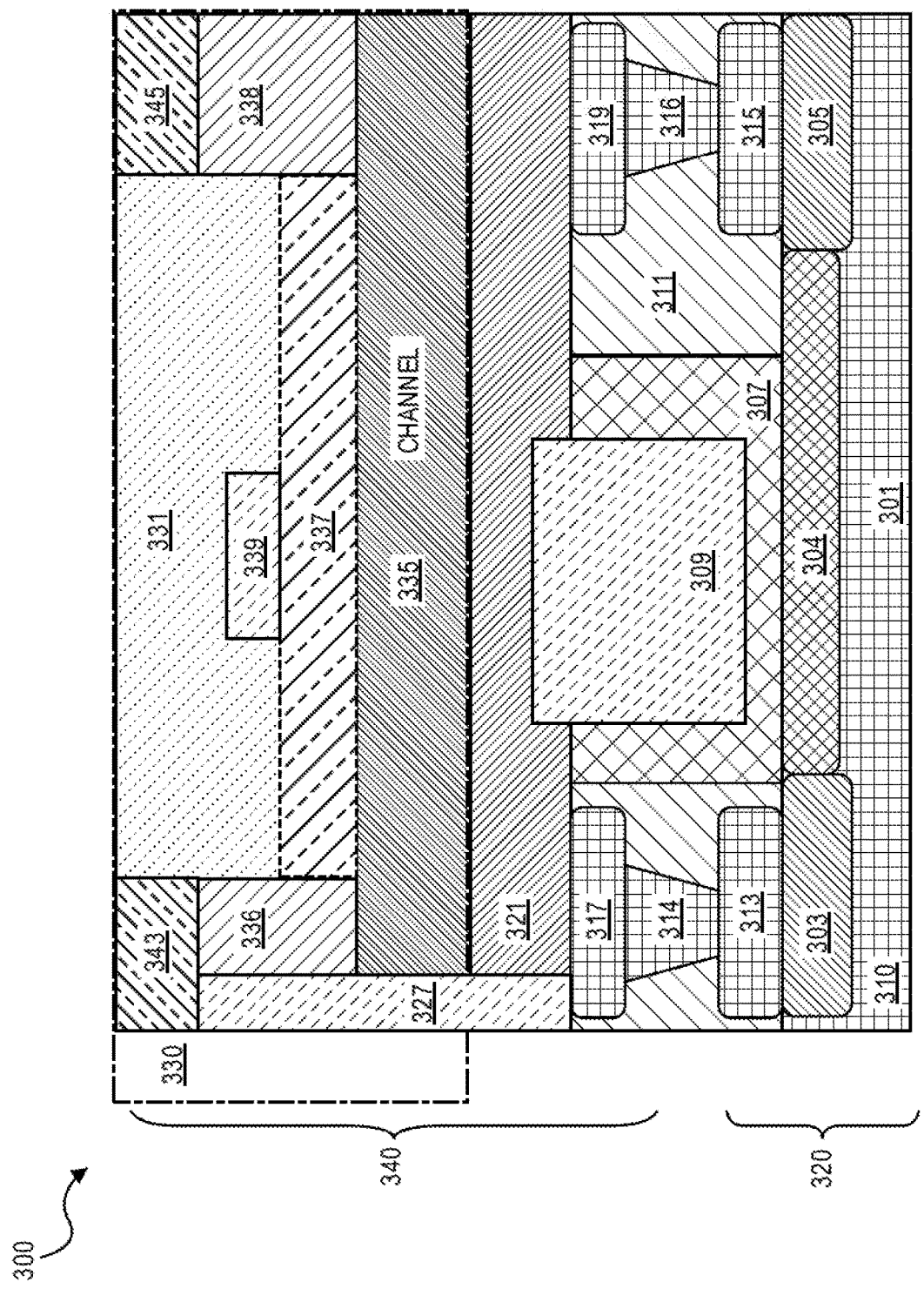
FIG. 3 schematically illustrates a diagram of an IC including a second transistor stacked over a first transistor with a channel in a substrate, in accordance with some embodiments.

FIG. 3 schematically illustrates a diagram of an IC 300 including a second transistor 330 stacked over a first transistor 310 with a channel 304 in a substrate 301, in accordance with some embodiments. In embodiments, the IC 300, the transistor 330, the transistor 310, the channel 304, and the substrate 301 may be similar to the IC 100, the transistor 130, the transistor 110, the channel 104, and the substrate 101 shown in FIG. 1. Various other layers of the IC 300, the transistor 330, and the transistor 310, may be similar to corresponding layers in the IC 100, the transistor 130, and the transistor 110, in FIG. 1.

In embodiments, the IC 300 may include the transistor 310, an insulator layer 321 above the transistor 310, and the transistor 330 above the insulator layer 321. The transistor 310 may be at FEOL 320, while the transistor 330 and the insulator layer 321 may be at BEOL 340. The transistor 310 may be a p-type transistor, and may include the channel 304 in the substrate 301, a source electrode 313 above a source area 303, and a drain electrode 315 above a drain area 305. The channel 304 may be between the source area 303 and the drain area 305. The transistor 310 may further include a gate electrode 309 above the channel 304 separated by a gate dielectric layer 307.

In embodiments, the source electrode 313 may be coupled to a metal contact 317 by a via 314, and the drain electrode 315 may be coupled to a metal contact 319 by a via 316. The source electrode 313, the metal contact 317, the via 314, the drain electrode 315, the metal contact 319, the via 316, and the gate electrode 309 may be within an ILD layer 311. The metal contact 317 and the metal contact 319 may be located in a first metal layer M1, while the source electrode 313 and the drain electrode 315 may be located in the metal layer M0. In embodiments, the insulator layer 321 may be next to the metal contact 317 and the metal contact 319. The insulator layer 321 may include metal contacts, not shown.

In embodiments, the transistor 330 may be a thin film transistor (TFT) with a channel layer above the insulator layer, and a gate electrode above the channel layer. In detail, the transistor 330 may include a channel layer 335 above the insulator layer 321, a gate electrode 339 above the channel layer 335 and separated by a gate dielectric layer 337, a source area 336 adjacent to the channel layer 335, a drain area 338 adjacent to the channel layer 335, a source electrode 343 above the source area 336, and a drain electrode 345 above the drain area 338 separated by an ILD layer 331 from the source electrode 343.

In embodiments, the source electrode 343 may be coupled with the metal contact 317 by a via 327 through the insulator layer 321. The gate electrode 309 of the transistor 310 may be partially embedded within the insulator layer 321. In addition, the drain electrode 345 may be coupled with the metal contact 319, not shown.

Figure 4:
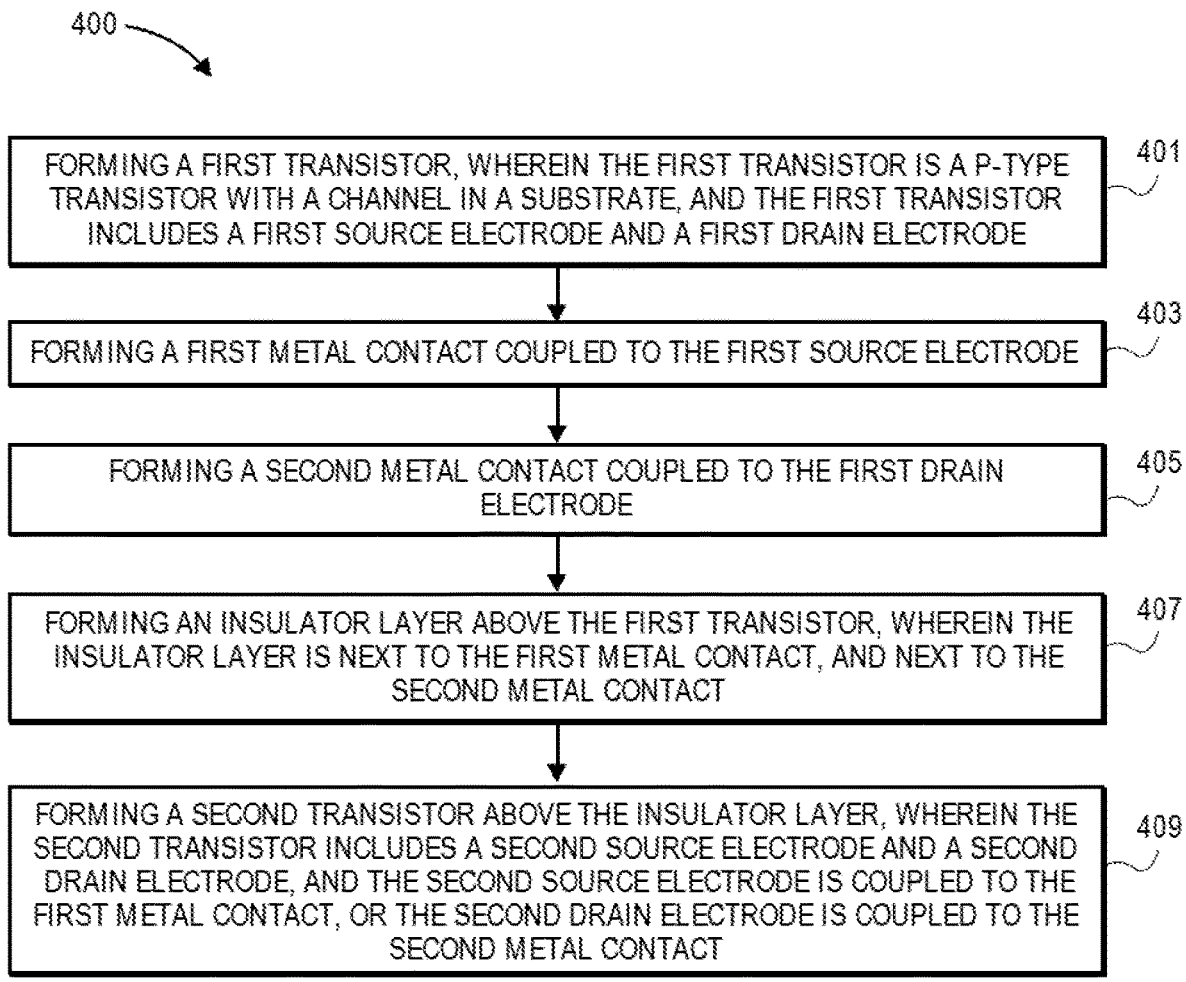
FIG. 4 illustrates a process for forming an IC including a second transistor stacked over a first transistor with a channel in a substrate, in accordance with some embodiments.

FIG. 4 illustrates a process 400 for forming an IC including a second transistor stacked over a first transistor with a channel in a substrate, in accordance with some embodiments. In embodiments, the process 400 may be applied to form the IC 100 including the transistor 130 stacked over the transistor 110 in FIG. 1, the IC 200 including the transistor 230 stacked over the transistor 210 in FIG. 2, or the IC 300 including the transistor 330 stacked over the transistor 310 in FIG. 3.

At block 401, the process 400 may include forming a first transistor, wherein the first transistor is a p-type transistor with a channel in a substrate, and the first transistor includes a first source electrode and a first drain electrode. For example, the process 400 may include forming the transistor 110, which may be a p-type transistor with the channel 104 in the substrate 101, and further include the source electrode 113 and the drain electrode 115.

At block 403, the process 400 may include forming a first metal contact coupled to the first source electrode by a first via. For example, the process 400 may include forming the metal contact 117 coupled to the source electrode 113 by the via 114.

At block 405, the process 400 may include forming a second metal contact coupled to the first drain electrode by a second via. For example, the process 400 may include forming the metal contact 119 coupled to the drain electrode 115 by the via 116.

At block 407, the process 400 may include forming an insulator layer above the first transistor, wherein the insulator layer is next to the first metal contact, and next to the second metal contact. For example, the process 400 may include forming the insulator 121 layer above the transistor 110, wherein the insulator layer 121 may be next to the metal contact 117 and the metal contact 119.

At block 409, the process 400 may include forming a second transistor above the insulator layer, wherein the second transistor includes a second source electrode and a second drain electrode, and the second source electrode is coupled to the first metal contact, or the second drain electrode is coupled to the second metal contact. For example, the process 400 may include forming the transistor 130 above the insulator layer 121, wherein the transistor 130 may include the source electrode 143 and the drain electrode 145. The source electrode 145 may be coupled to the metal contact 117, or the drain electrode 145 may be coupled to the metal contact 119.

In embodiments, the process 400 may include one or more additional operations than those depicted by FIG. 4. For example, the process 400 may include forming an ILD layer, e.g., the ILD layer 111 shown in FIG. 1. Additionally or alternatively, the process 400 may include forming a gate dielectric layer to separate the gate electrode from the channel layer.

Figure 5:
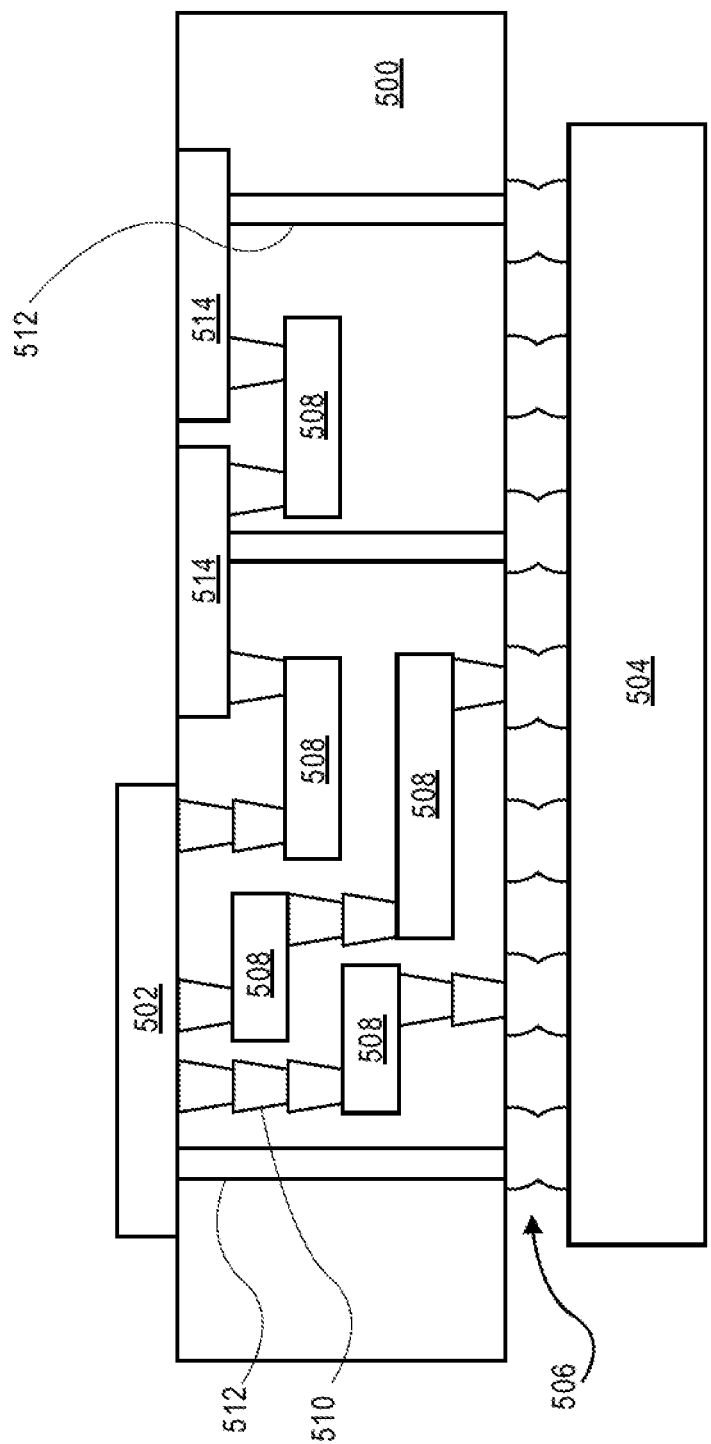
FIG. 5 schematically illustrates an interposer implementing one or more embodiments of the disclosure, in accordance with some embodiments.

FIG. 5 illustrates an interposer 500 that includes one or more embodiments of the disclosure. The interposer 500 is an intervening substrate used to bridge a first substrate 502 to a second substrate 504. The first substrate 502 may be, for instance, a substrate support for the transistor 130 stacked over the transistor 110 in FIG. 1, the transistor 230 stacked over the transistor 210 in FIG. 2, or the transistor 330 stacked over the transistor 310 in FIG. 3. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500.

In accordance with embodiments of the disclosure, apparatuses or processes disclosed herein may be used in the fabrication of interposer 500.

Figure 6:
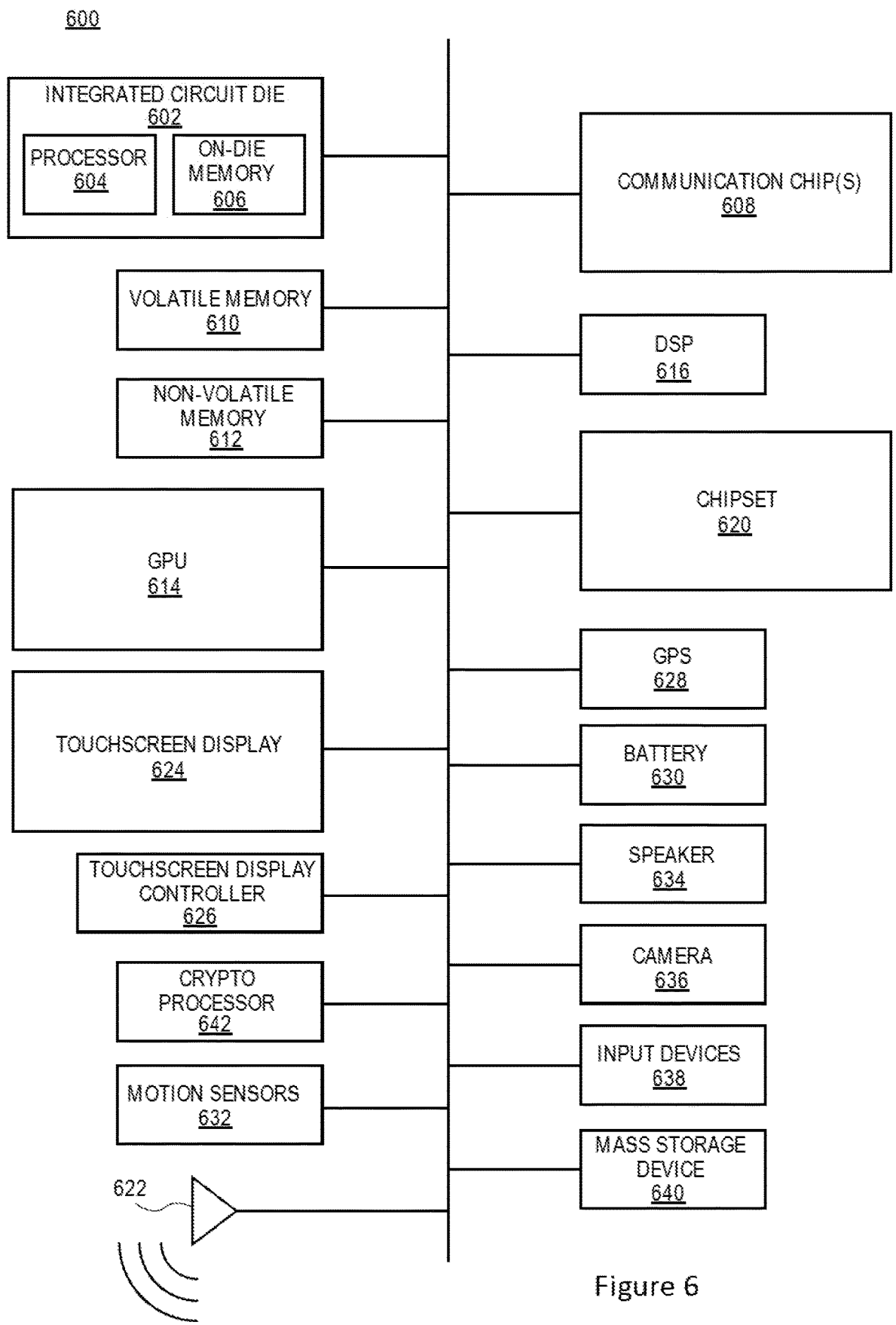
FIG. 6 schematically illustrates a computing device built in accordance with an embodiment of the disclosure, in accordance with some embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the on-die memory 606, the communications logic unit 608, or the integrated circuit die 602, may include, e.g., the transistor 130 stacked over the transistor 110 in FIG. 1, the transistor 230 stacked over the transistor 210 in FIG. 2, or the transistor 330 stacked over the transistor 310 in FIG. 3.

In embodiments, the computing device 600 may include a display or a touchscreen display 624, and a touchscreen display controller 626. A display or the touchscreen display 624 may include a FPD, an AMOLED display, a TFT LCD, a micro light-emitting diode (μLED) display, or others. For example, the touchscreen display 624 may include e.g., the transistor 130 stacked over the transistor 110 in FIG. 1, the transistor 230 stacked over the transistor 210 in FIG. 2, or the transistor 330 stacked over the transistor 310 in FIG. 3.

Computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as DRAM, that are formed in accordance with implementations of the current disclosure, e.g., the transistor 130 stacked over the transistor 110 in FIG. 1, the transistor 230 stacked over the transistor 210 in FIG. 2, or the transistor 330 stacked over the transistor 310 in FIG. 3.

In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some Non-Limiting Examples are Provided Below.

Example 1 may include an integrated circuit (IC), comprising: a first transistor, wherein the first transistor is a p-type transistor with a channel in a substrate, and the first transistor includes a first source electrode and a first drain electrode; a first metal contact coupled to the first source electrode; a second metal contact coupled to the first drain electrode; an insulator layer above the first transistor, wherein the insulator layer is next to the first metal contact, and next to the second metal contact; and a second transistor above the insulator layer, wherein the second transistor includes a second source electrode, and a second drain electrode, and the second source electrode is coupled to the first metal contact, or the second drain electrode is coupled to the second metal contact.

Example 2 may include the integrated circuit of example 1 and/or some other examples herein, wherein the first metal contact and the second metal contact are located in a first metal layer of the IC.

Example 3 may include the integrated circuit of example 1 and/or some other examples herein, wherein the first transistor is located at front-end of the line (FEOL) of the IC, and the second transistor is located at back-end (BEOL) of the line of the IC.

Example 4 may include the integrated circuit of example 1 and/or some other examples herein, wherein the second transistor is a p-type transistor, and includes a channel layer having a material selected from the group consisting of CuO, $ZnRh_2O_4$, $AlCuO_2$, $SrCu_2O_2$, $La_2SeO_2$, $Pr_2SeO_2$, $Nd_2SeO_2$, $Gd_2SeO_2$, NiO, SiC, SnO, $Cu_2O$, and $VO_2$.

Example 5 may include the integrated circuit of example 1 and/or some other examples herein, wherein the second transistor is an n-type transistor, and includes a channel layer having a material selected from the group consisting of ZnO, CdO, $In_2O_3$, $Ga_2O_3$, $SnO_2$, IGZO, IZO, ITO, GZO, $TiO_2$, SiC, SnO, $Cu_2O$, and $VO_2$.

Example 6 may include the integrated circuit of example 1 and/or some other examples herein, wherein the second transistor is a thin film transistor (TFT) with a channel layer above the insulator layer, and a gate electrode above the channel layer.

Example 7 may include the integrated circuit of example 1 and/or some other examples herein, wherein the second transistor is a thin film transistor (TFT) with a gate electrode above the insulator layer, and a channel layer above the gate electrode.

Example 8 may include the integrated circuit of example 1 and/or some other examples herein, wherein the insulator layer is of a planar shape, and includes an oxide material.

Example 9 may include the integrated circuit of example 1 and/or some other examples herein, wherein the insulator layer has a thickness in a range of about 5 nm to about 20 nm.

Example 10 may include the integrated circuit of example 1 and/or some other examples herein, wherein the insulator layer includes a metal interconnect.

Example 11 may include the integrated circuit of example 1 and/or some other examples herein, wherein the first transistor is a planar transistor, or a FinFET transistor.

Example 12 may include the integrated circuit of example 1 and/or some other examples herein, wherein the second source electrode is coupled with the first metal contact through the insulator layer, or the second drain electrode is coupled with the second metal contact through the insulator layer.

Example 13 may include the integrated circuit of example 1 and/or some other examples herein, wherein the first transistor includes a first gate electrode, the second transistor includes a second gate electrode coupled with the first gate electrode through the insulator layer.

Example 14 may include the integrated circuit of example 1 and/or some other examples herein, wherein the first transistor includes a first gate electrode partially embedded within the insulator layer.

Example 15 may include the integrated circuit of example 1 and/or some other examples herein, wherein a shadow of the second transistor is substantially overlapped with the first transistor.

Example 16 may include the integrated circuit of example 1 and/or some other examples herein, wherein the first metal contact, the second metal contact, the first source electrode, the first drain electrode, the second source electrode, or the second drain electrode includes a material selected from the group consisting of Ti, W, molybdenum (Mo), gold (Au), platinum (Pt), aluminum (Al), nickel (Ni), copper (Cu), chromium (Cr), hafnium (Hf), indium (In), and an alloy of Ti, W, Mo, Au, Pt, Al, Ni, Cu, Cr, TiAlN, HfAlN, or InAlO.

Example 17 may include a method for forming an integrated circuit (IC), the method comprising: forming a first transistor, wherein the first transistor is a p-type transistor with a channel in a substrate, and the first transistor includes a first source electrode and a first drain electrode; forming a first metal contact coupled to the first source electrode; forming a second metal contact coupled to the first drain electrode; forming an insulator layer above the first transistor, wherein the insulator layer is next to the first metal contact, and next to the second metal contact; and forming a second transistor above the insulator layer, wherein the second transistor includes a second source electrode and a second drain electrode, and the second source electrode is coupled to the first metal contact, or the second drain electrode is coupled to the second metal contact.

Example 18 may include the method of example 17 and/or some other examples herein, wherein the forming the second transistor including forming the second transistor in a temperature less than about 450 C.

Example 19 may include the method of example 17 and/or some other examples herein, wherein the first metal contact and the second metal contact are located in a first metal layer of the IC.

Example 20 may include the method of example 17 and/or some other examples herein, wherein the second transistor is a thin film transistor (TFT) with a gate electrode above the insulator layer, and a channel layer above the gate electrode.

Example 21 may include a computing device, comprising: a circuit board; and an integrated circuit (IC) coupled to the circuit board, wherein the IC includes: a first transistor, wherein the first transistor is a p-type transistor with a channel in a substrate, and the first transistor includes a first source electrode and a first drain electrode; a first metal contact coupled to the first source electrode; a second metal contact coupled to the first drain electrode; an insulator layer above the first transistor, wherein the insulator layer is next to the first metal contact, and next to the second metal contact; and a second transistor above the insulator layer, wherein the second transistor includes a second source electrode and a second drain electrode, and the second source electrode is coupled to the first metal contact, or the second drain electrode is coupled to the second metal contact.

Example 22 may include the computing device of example 21 and/or some other examples herein, wherein the first metal contact and the second metal contact are located in a first metal layer of the IC.

Example 23 may include the computing device of example 21 and/or some other examples herein, wherein the second transistor is a p-type transistor, and includes a channel layer having a material selected from the group consisting of CuO, $ZnRh_2O_4$, $AlCuO_2$, $SrCu_2O_2$, $La_2SeO_2$, $Pr_2SeO_2$, $Nd_2SeO_2$, $Gd_2SeO_2$, NiO, SiC, SnO, $Cu_2O$, and $VO_2$.

Example 24 may include the computing device of example 21 and/or some other examples herein, wherein the second transistor is an n-type transistor, and includes a channel layer having a material selected from the group consisting of ZnO, CdO, $In_2O_3$, $Ga_2O_3$, $SnO_2$, IGZO, IZO, ITO, GZO, $TiO_2$, SiC, SnO, $Cu_2O$, and $VO_2$.

Example 25 may include the computing device of example 21 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC), comprising:
   a first transistor, wherein the first transistor is a p-type transistor with a channel in a substrate, and the first transistor includes a first source electrode and a first drain electrode;
   a first metal contact coupled to the first source electrode;
   a second metal contact coupled to the first drain electrode;
   an insulator layer above the first transistor, wherein the insulator layer is next to the first metal contact, and next to the second metal contact; and
   a second transistor above the insulator layer, wherein the second transistor includes a second source electrode, and a second drain electrode, and the second source electrode is coupled to the first metal contact, or the second drain electrode is coupled to the second metal contact.

2. The integrated circuit of claim 1, wherein the first metal contact and the second metal contact are located in a first metal layer of the IC.

3. The integrated circuit of claim 1, wherein the first transistor is located at front-end of the line (FEOL) of the IC, and the second transistor is located at back-end (BEOL) of the line of the IC.

4. The integrated circuit of claim 1, wherein the second transistor is a p-type transistor, and includes a channel layer having a material selected from the group consisting of CuO, $ZnRh_2O_4$, $AlCuO_2$, $SrCu_2O_2$, $La_2SeO_2$, $Pr_2SeO_2$, $Nd_2SeO_2$, $Gd_2SeO_2$, NiO, SiC, SnO, $Cu_2O$, and $VO_2$.

5. The integrated circuit of claim 1, wherein the second transistor is an n-type transistor, and includes a channel layer having a material selected from the group consisting of ZnO, CdO, $In_2O_3$, $Ga_2O_3$, $SnO_2$, IGZO, IZO, ITO, GZO, $TiO_2$, SiC, SnO, $Cu_2O$, and $VO_2$.

6. The integrated circuit of claim 1, wherein the second transistor is a thin film transistor (TFT) with a channel layer above the insulator layer, and a gate electrode above the channel layer.

7. The integrated circuit of claim 1, wherein the second transistor is a thin film transistor (TFT) with a gate electrode above the insulator layer, and a channel layer above the gate electrode.

8. The integrated circuit of claim 1, wherein the insulator layer is of a planar shape, and includes an oxide material.

9. The integrated circuit of claim 1, wherein the insulator layer has a thickness in a range of about 5 nm to about 20 nm.

10. The integrated circuit of claim 1, wherein the insulator layer includes a metal interconnect.

11. The integrated circuit of claim 1, wherein the first transistor is a planar transistor, or a FinFET transistor.

12. The integrated circuit of claim 1, wherein the second source electrode is coupled with the first metal contact through the insulator layer, or the second drain electrode is coupled with the second metal contact through the insulator layer.

13. The integrated circuit of claim 1, wherein the first transistor includes a first gate electrode, the second transistor includes a second gate electrode coupled with the first gate electrode through the insulator layer.

14. The integrated circuit of claim 1, wherein the first transistor includes a first gate electrode partially embedded within the insulator layer.

15. The integrated circuit of claim 1, wherein a shadow of the second transistor is substantially overlapped with the first transistor.

16. The integrated circuit of claim 1, wherein the first metal contact, the second metal contact, the first source electrode, the first drain electrode, the second source electrode, or the second drain electrode includes a material selected from the group consisting of Ti, W, molybdenum (Mo), gold (Au), platinum (Pt), aluminum (Al), nickel (Ni), copper (Cu), chromium (Cr), hafnium (Hf), indium (In), and an alloy of Ti, W, Mo, Au, Pt, Al, Ni, Cu, Cr, TiAlN, HfAlN, or InAlO.

17. A method for forming an integrated circuit (IC), the method comprising:
   forming a first transistor, wherein the first transistor is a p-type transistor with a channel in a substrate, and the first transistor includes a first source electrode and a first drain electrode;

forming a first metal contact coupled to the first source electrode;

forming a second metal contact coupled to the first drain electrode;

forming an insulator layer above the first transistor, wherein the insulator layer is next to the first metal contact, and next to the second metal contact; and forming a second transistor above the insulator layer, wherein the second transistor includes a second source electrode and a second drain electrode, and the second source electrode is coupled to the first metal contact, or the second drain electrode is coupled to the second metal contact.

18. The method of claim 17, wherein the forming the second transistor including forming the second transistor in a temperature less than about 450C.

19. The method of claim 17, wherein the first metal contact and the second metal contact are located in a first metal layer of the IC.

20. The method of claim 17, wherein the second transistor is a thin film transistor (TFT) with a gate electrode above the insulator layer, and a channel layer above the gate electrode.

21. A computing device, comprising:
a circuit board; and
an integrated circuit (IC) coupled to the circuit board, wherein the IC includes:
a first transistor, wherein the first transistor is a p-type transistor with a channel in a substrate, and the first transistor includes a first source electrode and a first drain electrode;
a first metal contact coupled to the first source electrode;
a second metal contact coupled to the first drain electrode;
an insulator layer above the first transistor, wherein the insulator layer is next to the first metal contact, and next to the second metal contact; and
a second transistor above the insulator layer, wherein the second transistor includes a second source electrode and a second drain electrode, and the second source electrode is coupled to the first metal contact, or the second drain electrode is coupled to the second metal contact.

22. The computing device of claim 21, wherein the first metal contact and the second metal contact are located in a first metal layer of the IC.

23. The computing device of claim 21, wherein the second transistor is a p-type transistor, and includes a channel layer having a material selected from the group consisting of CuO, $ZnRh_2O_4$, $AlCuO_2$, $SrCu_2O_2$, $La_2SeO_2$, $Pr_2SeO_2$, $Nd_2SeO_2$, $Gd_2SeO_2$, NiO, SiC, SnO, $Cu_2O$, and $VO_2$.

24. The computing device of claim 21, wherein the second transistor is an n-type transistor, and includes a channel layer having a material selected from the group consisting of ZnO, CdO, $In_2O_3$, $Ga_2O_3$, $SnO_2$, IGZO, IZO, ITO, GZO, $TiO_2$, SiC, SnO, $Cu_2O$, and $VO_2$.

25. The computing device of claim 21, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *